(12) United States Patent
Lin et al.

(10) Patent No.: US 9,360,749 B2
(45) Date of Patent: Jun. 7, 2016

(54) PELLICLE STRUCTURE AND METHOD FOR FORMING THE SAME

(71) Applicant: Taiwan Semiconductor Manufacturing Co., Ltd, Hsin-Chu (TW)

(72) Inventors: Yun-Yue Lin, Hsinchu (TW); Chia-Jen Chen, Jhudong Township (TW); Hsin-Chang Lee, Zhubei (TW); Anthony Yen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 91 days.

(21) Appl. No.: 14/260,651

(22) Filed: Apr. 24, 2014

(65) Prior Publication Data

US 2015/0309404 A1   Oct. 29, 2015

(51) Int. Cl.
   *G03F 1/62*    (2012.01)
   *G03F 1/64*    (2012.01)
   *G03F 1/00*    (2012.01)

(52) U.S. Cl.
   CPC  *G03F 1/62* (2013.01); *G03F 1/142* (2013.01); *G03F 1/64* (2013.01)

(58) Field of Classification Search
   CPC .............. G03F 1/142; G03F 1/62; G03F 1/64
   USPC ............................................................ 430/5
   See application file for complete search history.

(56) References Cited

U.S. PATENT DOCUMENTS

| 4,465,759 A | 8/1984 | Duly et al. |
| 7,767,985 B2 | 8/2010 | Okoroanyanwu et al. |
| 7,951,513 B2 | 5/2011 | Kubota et al. |
| 8,518,612 B2 | 8/2013 | Akiyama et al. |
| 2013/0250260 A1* | 9/2013 | Singh .................. G03F 1/62 355/53 |

FOREIGN PATENT DOCUMENTS

KR   10-2013-0088565 A   8/2013

* cited by examiner

*Primary Examiner* — Christopher Young
(74) *Attorney, Agent, or Firm* — Birch, Stewart, Kolasch & Birch, LLP

(57) ABSTRACT

A pellicle structure, a pellicle-mask structure, and a method for forming the pellicle structure are provided. The pellicle structure includes a pellicle film made of a carbon-based material. In addition, the pellicle film is configured to protect a mask structure in a lithography process. The pellicle-mask structure includes a mask substrate having a mask pattern formed over the mask substrate and the pellicle frame disposed on the mask substrate. The pellicle-mask structure further includes the pellicle film disposed on the pellicle frame.

21 Claims, 5 Drawing Sheets

"PELLICLE STRUCTURE AND METHOD FOR FORMING THE SAME"

BACKGROUND

Semiconductor devices are used in a variety of electronic applications, such as personal computers, cell phones, digital cameras, and other electronic equipment. Semiconductor devices are typically fabricated by subsequently depositing insulating or dielectric layers, conductive layers, and semiconductive layers of material over a semiconductor substrate, and patterning the various material layers using lithography to form circuit components and elements thereon.

One important driver for increasing performance in a semiconductor device is the higher levels of integration of circuits. This is accomplished by miniaturizing or shrinking device sizes on a given chip. Extreme ultraviolet (EUV) lithography technology has been developed in order to transfer finer patterns onto wafers. The EUV lithograph technology is considered a next-generation technology which will be used to fabricate a slimmer and faster microchip.

However, although the existing EUV lithograph technology has been generally adequate for its intended purpose, as device scaling-down continues, it has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
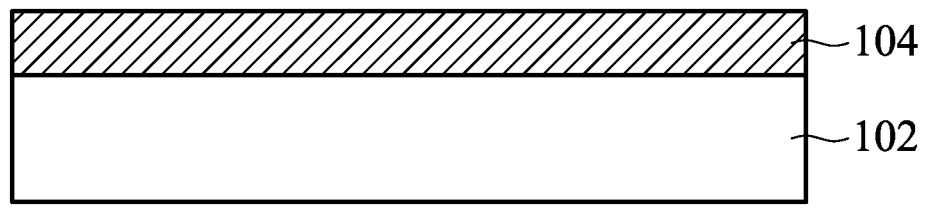
FIGS. 1A to 1F are cross-sectional representations of various stages of forming a pellicle structure in accordance with some embodiments.
Figure 1B:
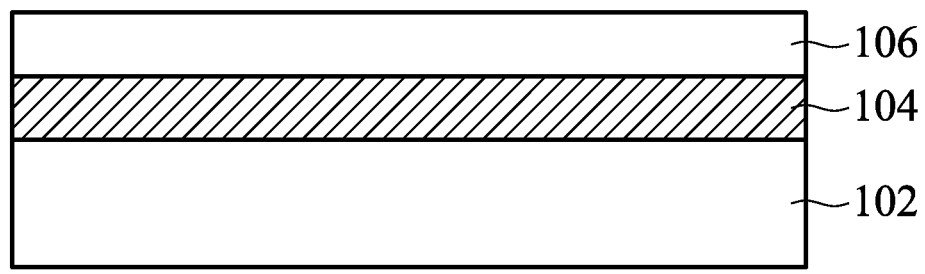

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of forming a pellicle structure are provided in accordance with some embodiments of the disclosure. The pellicle structure is made of a carbon-based material and may be used to protect a mask structure in a lithography process. FIGS. 1A to 1F are cross-sectional representations of various stages of forming a pellicle structure 100 in accordance with some embodiments.

Referring to FIG. 1A, a substrate 102 is provided in accordance with some embodiments. Substrate 102 may be a quartz substrate or an ultra-smooth substrate. Substrate 102 should be flat enough such that the pellicle film formed over substrate 102 in the subsequent processes can be flat.

A metal layer 104 is formed over substrate 102 in accordance with some embodiments. Metal layer 104 may be seen as a sacrificial layer to improve the formation of the pellicle film in the subsequent processes. In some embodiments, metal layer 104 is made of copper (Cu), nickel (Ni), iron (Fe), zinc (Zn), tantalum (Ta), indium (In), manganese (Mn), chromium (Cr), titanium (Ti), platinum (Pt), magnesium (Mg), aluminum (Al), zirconium (Zr), iridium (Ir), tungsten (W), lanthanum (La), niobium (Nb), cobalt (Co), molybdenum (Mo), silver (Ag), gold (Au), or related alloy. Metal layer 104 may be formed by sputtering, printing, electroplating, electro-less plating, electrochemical deposition (ECD), molecular beam epitaxy (MBE), atomic layer deposition (ALD), physical vapor deposition (PVD), and/or commonly used CVD methods.

Next, a pellicle film 106 is formed over metal layer 104, as shown in FIG. 1A in accordance with some embodiments. In some embodiments, pellicle film 106 is made of a carbon-based material, such as graphene. Graphene is a 2-dimensional carbon structure including carbon atoms densely packed in $sp^2$-bonded. Graphene has high transparency, good mechanical strength, and excellent heat conductivity. Therefore, pellicle film 106 made of graphene can be thin enough while still having a high enough mechanical strength.

In some embodiments, pellicle film 106 is a single-layer graphene, a double-layer graphene, or a multiple-layer graphene. Pellicle film 106 may be formed by chemical vapor deposition (CVD), physical vapor deposition (PVD), atomic layer deposition (ALD), high density plasma CVD (HD-PCVD), plasma enhanced CVD (PECVD), or a thermal process such as a furnace deposition.

Figure 1C:
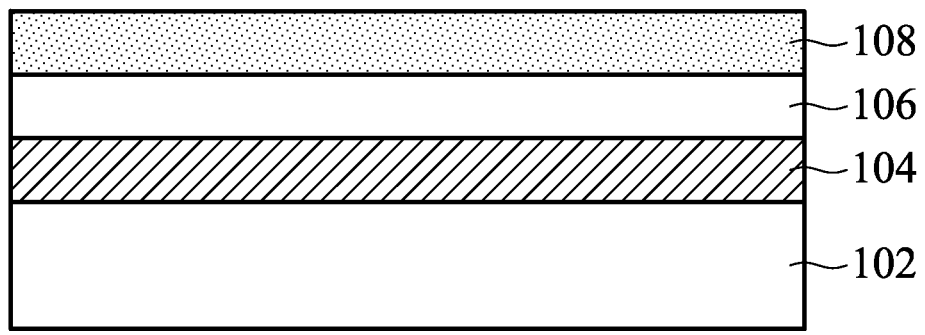

Afterwards, a polymer layer 108 is formed over pellicle film 106, as shown in FIG. 1C in accordance with some embodiments. In some embodiments, polymer layer 108 is made of materials such as polymethylmethacrylate (PMMA), polystyrene (PS), polyimide, epoxy, benzocyclobutene (BCB), or polybenzoxazole (PBO). In some embodiments, polymer layer 108 is made of polymethylmethacrylate (PMMA) or polystyrene (PS), such that polymer layer 108 can be easily removed without damaging pellicle film 106 in subsequent processes. Polymer layer 108 may be formed by CVD, PVD, or other applicable techniques.

Figure 1D:
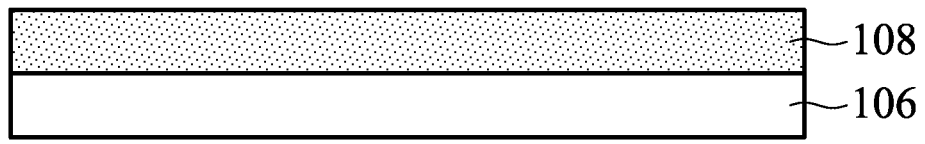

After polymer layer 108 is formed, substrate 102 and metal layer 104 are removed from pellicle film 106, as shown in FIG. 1D in accordance with some embodiments. In some embodiments, substrate 102 and metal layer 104 are removed by a SPM (Sulfuric acid and hydrogen peroxide mixture) process. In some embodiments, substrate 102 and metal layer 104 are removed by using a mixture including $H_2SO_4$, $H_2O_2$, and $Fe(NO_3)_3$ and iron nitrate (FeCl3)

Figure 1E:
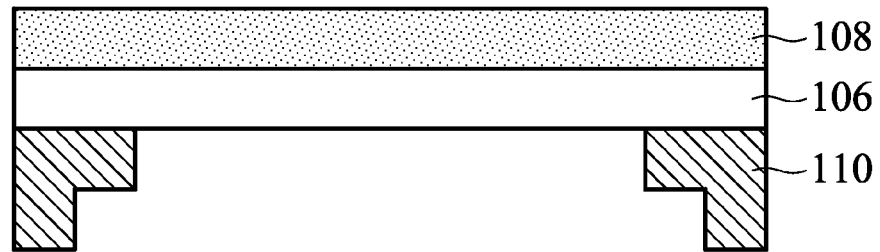

Next, a pellicle frame 110 is attached to pellicle film 106, as shown in FIG. 1E in accordance with some embodiments. Pellicle frame 110 is configured to secure pellicle film 106 to a mask structure in accordance with some embodiments. Pellicle frame 110 may include one piece or various parts made of a material having enough mechanical strength to secure pellicle film 106. In some embodiments, pellicle frame 110 is made of aluminum or aluminum alloy.

In some embodiments, pellicle frame 110 is attached to pellicle film 106 through electrostatic force. In some embodiments, pellicle frame 110 (and/or pellicle film 106) is exposed to an X-ray, such that charges are induced at a top surface of pellicle frame 110, and the top surface of pellicle frame 110 is attached to pellicle film 106 afterwards. Since pellicle film 106 is made of carbon-based material, pellicle film 106 can be attached to pellicle frame 110 through electrostatic force, which can prevent pellicle structure 100 from being contaminated. However, it should be noted that other methods may additionally or alternatively be used to attach pellicle frame 110. For example, pellicle frame 110 may be attached to pellicle film 106 by using an adhesive, such as a glue.

Figure 1F:
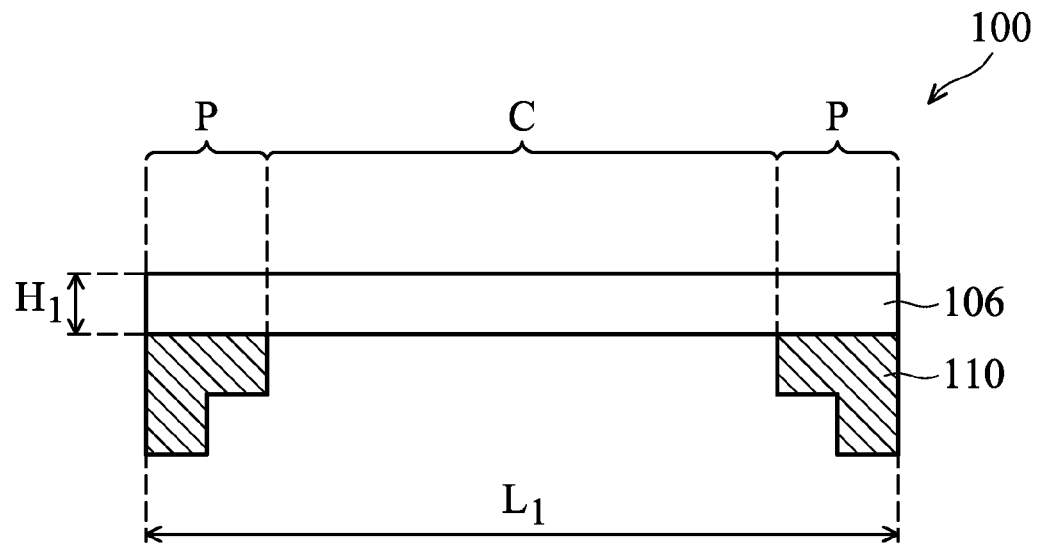

After pellicle frame 110 is attached to pellicle film 106, polymer layer 108 is removed from pellicle film 106, as shown in FIG. 1F in accordance with some embodiments. In some embodiments, polymer layer 108 is removed by a wet treatment, such as using acetone. After polymer layer 108 is removed, pellicle structure 100 is ready to be disposed on a mask structure and to be used in a lithography process.

As shown in FIG. 1F, pellicle structure 100 includes pellicle film 106 and pellicle frame 110 in accordance with some embodiments. In addition, pellicle film 106 has a peripheral region P and a central region C, and pellicle frame 110 is in direct contact with peripheral region P of pellicle film 106. In addition, since pellicle film 106 is made of the carbon-based material having sufficient mechanical strength, a supporting structure is required, especially at central region C of pellicle film 106. Therefore, optical shadow effect resulting from the supporting structure formed in or on a pellicle film is avoided.

In some embodiments, pellicle film 106 has a thickness $H_1$ in a range from about 0.01 μm to about 100 μm. When thickness $H_1$ of pellicle film 106 is too great, the absorbency of pellicle film 106 may increase. When thickness $H_1$ of pellicle film 106 is too low, pellicle film 106 may tend to be broken.

In some embodiments, pellicle film 106 is in a shape of a rectangle. In some embodiments, pellicle film 106 has a length $L_1$ in a range from about 6 inches to about 10 inches. Since pellicle film 106 is made of a carbon-based material such as graphene, pellicle film 106 may have a relatively large size with a great mechanical strength.

Figure 2:
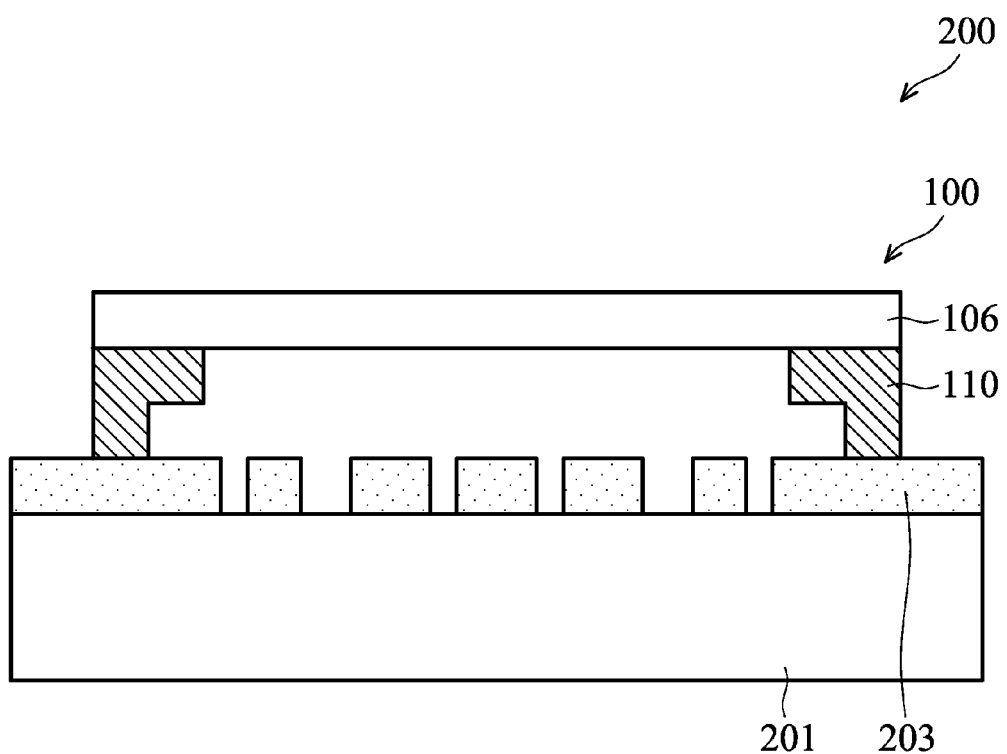
FIG. 2 is a cross-sectional representation of a pellicle-mask structure in accordance with some embodiments.

FIG. 2 is a cross-sectional representation of a pellicle-mask structure 200 in accordance with some embodiments. Pellicle-mask structure 200 may be used in a process for manufacturing a semiconductor structure, such as a semiconductor wafer. Pellicle-mask structure 200 may include pellicle structure 100 shown in FIG. 1F and a mask structure, and pellicle film 106 may be secured to the mask structure by pellicle frame 110.

More specifically, pellicle-mask structure 200 includes a mask substrate 201 having a mask pattern 203 formed thereon, pellicle frame 110 disposed on mask substrate 201, and pellicle film 106 disposed on pellicle frame 110 in accordance with some embodiments.

In some embodiments, mask substrate 201 is a transparent substrate, such as fused silica ($SiO_2$) relatively free of defects, borosilicate glass, soda-lime glass, calcium fluoride, or other applicable materials. Mask pattern 203 formed on the mask substrate 201 may be designed according to integrated circuit features to be formed on a semiconductor substrate during a lithography patterning process. Mask pattern 203 may be formed by depositing a material layer and patterning the material layer to have one or more openings where radiation beams may travel through without being absorbed, and one or more absorption areas where the radiation beams may be completely or partially blocked thereby.

The mask pattern 203 may include metal, metal alloy, metal silicide, metal nitride, metal oxide, metal oxynitride or other applicable materials. Examples of materials used to form mask pattern 203 may include, but are not limited to, Cr, $Mo_xSi_y$, $Ta_xSi_y$, Mo, $Nb_xO_y$, Ti, Ta, $Cr_xN_y$, $Mo_xO_y$, $Mo_xN_y$, $Cr_xO_y$, $Ti_xN_y$, $Zr_xN_y$, $Ti_xO_y$, $Ta_xN_y$, $Ta_xO_y$, $Si_xO_y$, $Nb_xN_y$, $Si_xN_y$, $Zr_xN_y$, $Al_xO_yN_z$, $Ta_xB_yO_z$, $Ta_xB_yN_z$, $Ag_xO_y$, $Ag_xN_y$, and or the like. The compound x/y/z ratio is not limited. The ratio can be 0-1.

Pellicle film 106, which is made of a carbon-based material, is secured to mask substrate 201 by pellicle frame 110, as shown in FIG. 2 in accordance with some embodiments. Pellicle film 106 protects the mask structure from fallen particles and keeps the particles out of focus so that they do not produce an image, which may cause defects during the lithography process. In some embodiments, pellicle frame 110 includes one or more ventilation holes (not shown) for ventilation. In some embodiments, mask substrate 201, pellicle film 106, and pellicle frame 110 form an enclosed mask space 205 filled with a single atom gas, such as Ar and He.

Pellicle-mask structure 200 shown in FIG. 2 may be used in a lithography patterning process. More specifically, a substrate, such as a semiconductor wafer, may be provided to form an integrated circuit pattern thereon. The semiconductor wafer may be further coated with a radiation-sensitive material layer, such as a photoresist layer. Mask-pellicle structure 200 may be used to pattern the semiconductor wafer. Mask pattern 203 formed on mask substrate 201 is defined with an integrated circuit pattern to be imaged on the semiconductor wafer. In some embodiments, the lithography process includes soft baking, mask aligning, exposing, post-exposure baking, developing photoresist, and hard baking.

Figure 3:
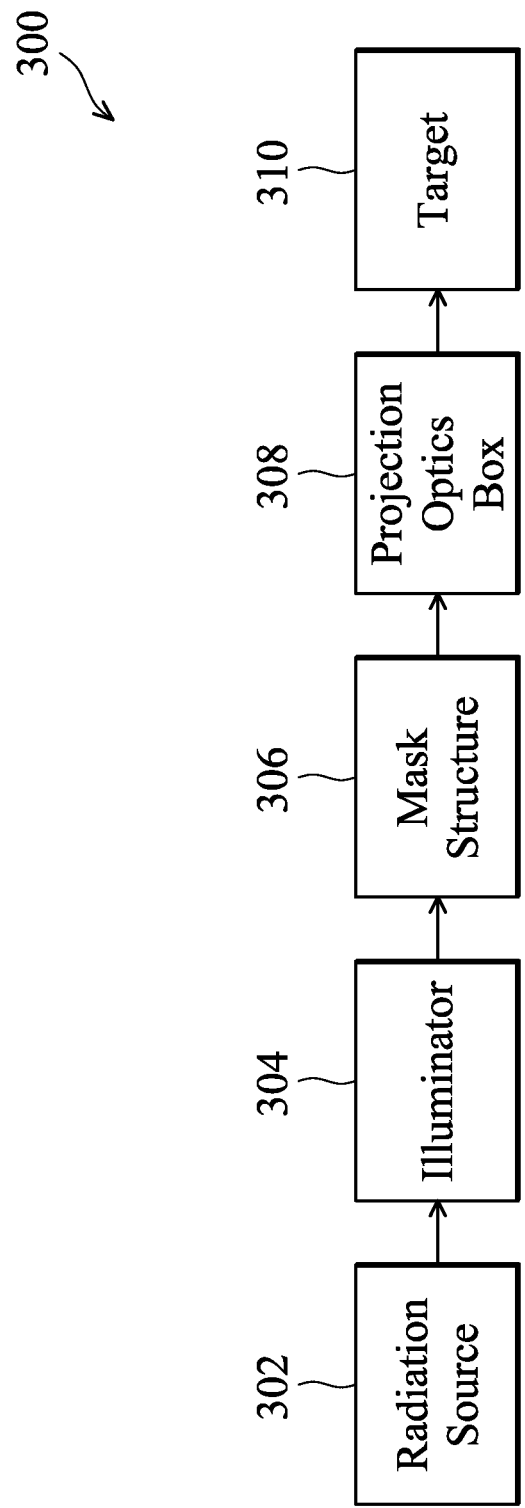
FIG. 3 illustrates an extreme ultraviolet (EUV) lithography process in accordance with some embodiments.

FIG. 3 illustrates an extreme ultraviolet (EUV) lithography process 300 in accordance with some embodiments. EUV lithography process 300 employs an EUV radiation source 302, an illuminator 304, a mask structure 306, a projection optics box (POB) 308, and a target 310 in accordance with some embodiments.

EUV radiation source 302 may have a wavelength in a range from about 1 nm to about 100 nm Illuminator 304 may include refractive optics, such as a single lens or a lens system having multiple lenses (zone plates), or reflective optics, such as a single mirror or a mirror system having multiple mirrors, to direct the radiation (e.g. light) from radiation source 302 onto mask structure 306. Generally, reflective optics is employed in the EUV lithography process.

Mask structure 306 may be pellicle-mask structure 200 shown in FIG. 2 or a mask structure including pellicle film 106 shown in FIG. 1F. Mask structure 306 may be a reflective mask, such as pellicle-mask structure 200. Mask structure 306 may incorporate other resolution enhancement techniques such as attenuated phase-shifting mask (AttPSM) and sub-resolution assist features. Sub-resolution assist features are not printed on target 310. However, they help to increase the exposure latitude (EL) or depth of focus (DOF) of main features.

Projection optics box 308 may have refractive optics or reflective optics. The radiation reflected from the mask structure 306 is collected by projection optics box 308 and directed to expose a target 310.

Target 310 may include a semiconductor substrate secured a substrate stage. The substrate stage may include motors, roller guides, and tables. The substrate stage may secure the semiconductor substrate by vacuum and provides the accurate position and movement of the semiconductor substrate during alignment, focus, leveling and exposing operation during EUV lithography process 300, such that the image of mask structure 306 can be transferred onto the semiconductor substrate.

A resist layer may be formed on the semiconductor substrate to expose by the image on the mask structure 306. The resist layer may be a positive tone resist or a negative tone resist. The semiconductor substrate may include one of a variety of types of substrates employed in semiconductor integrated circuit fabrication, and integrated circuits may be formed in and/or upon the semiconductor substrate. In some embodiments, the semiconductor substrate is a semiconductor wafer. The semiconductor substrate may be a silicon substrate. Alternatively or additionally, the semiconductor substrate may include elementary semiconductor materials, compound semiconductor materials, and/or alloy semiconductor materials. The elementary semiconductor materials may include, but are not limited to, crystal silicon, polycrystalline silicon, amorphous silicon, germanium, and/or diamond. The compound semiconductor materials may include, but are not limited to, silicon carbide, gallium arsenic, gallium phosphide, indium phosphide, indium arsenide, and/or indium antimonide. The alloy semiconductor materials may include, but are not limited to, SiGe, GaAsP, AlInAs, AlGaAs, GaInAs, GaInP, and/or GaInAsP.

In addition, the semiconductor substrate may further include a plurality of isolation features, such as shallow trench isolation (STI) features or local oxidation of silicon (LOCOS) features. The isolation features isolate various microelectronic elements formed in and/or upon the substrate.

Furthermore, the semiconductor substrate may further include an interconnection structure overlying the integrated circuits. The interconnection structure may include inter-layer dielectric layers and a metallization structure overlying the integrated circuits. The inter-layer dielectric layers in the metallization structure may include low-k dielectric materials, un-doped silicate glass (USG), silicon nitride (SiN), silicon oxynitride (SiON), or other commonly used materials. Metal lines in the metallization structure may be made of copper, copper alloys, or other applicable conductive materials.

It should be noted that although pellicle 106 is described as being used in a semiconductor fabricating process, pellicle 106 may also be used in other lithography processes, and the scope of the disclosure is not intended to be limiting. For example, pellicle 106 may be used to pattern other substrates such as a glass substrate used to form a thin film transistor liquid crystal display (TFT-LCD).

The material used to form a pellicle film should have great optical, thermal, and mechanical properties, such that the pellicle film can have high transmittance, high thermal conductivity, and high mechanical strength. Polymer or gel-based materials usually have high optical absorption and therefore may not applicable for forming a pellicle film.

Generally, a silicon-based material may be used to form a pellicle for having a good transmittance. However, the mechanical strength of the pellicle film made of the silicon-based material may be relatively weak, and therefore it may be difficult to transfer the silicon-based pellicle film to a mask structure. In addition, a supporting structure (e.g. hexagonal structures) may be required to be formed on the silicon-based pellicle film to prevent the film from breaking, when the silicon-based pellicle film has a relatively large size (e.g. larger than 6 inches). However, the formation of the supporting structure usually includes a complex lithography etching process, and stress may be induced on the silicon-based pellicle film due to the etching process. Furthermore, the supporting structure may result in mis-patterning due to optical shadow effect during the lithography process.

On the other hand, pellicle film 106 as described previously is made of a carbon-based material, such as graphene, which has a high transmittance. In addition, pellicle film 106 made of carbon-based material further has high mechanical strength and good thermal conductivity. Since pellicle film 106 has a higher mechanical strength (e.g. compared to a silicon-based pellicle film), it is easier to transfer pellicle film 106 to a mask structure without breaking pellicle film 106. In addition, no supporting structure is required to be formed in or on pellicle film 106. Therefore, the optical shadow effect during the lithography process is prevented, and complex lithography processes, which may induce stress in the pellicle film, are not required during the formation of pellicle film 106.

Furthermore, since pellicle film 106 has high thermal conductivity, energy resulting from the radiation during the lithography process may be released rapidly. Therefore, the risk of pellicle film 106 being damaged by the high energy of the radiation is reduced.

In addition, the carbon-based material can be formed by a soft-print methodology. Therefore, pellicle film 106 can be formed to have a greater size without using complicated processes. Moreover, pellicle frame 110 may be attached to pellicle film 106 through electrostatic force. Therefore, the attachment of pellicle frame 110 and pellicle film 106 may not require using an adhesive, and the risk of pellicle-mask structure 200 being contaminated by the adhesive or the adhesive damaged (e.g. degraded) by the radiation may be prevented.

Embodiments for forming a pellicle structure are provided. The pellicle structure includes a pellicle film, and the pellicle film is made of a carbon-based material. The pellicle film made of the carbon-based material can have a great transmittance. In addition, the pellicle film made of the carbon-based material can have a relatively high mechanical strength. Therefore, no supporting structure is required to be formed on or in the pellicle film, and the optical shadow effect resulting from the supporting structure during a lithography process is prevented.

In some embodiments, a pellicle structure is provided. The pellicle structure includes a pellicle film made of a carbon-based material. In addition, the pellicle film is configured to protect a mask structure in a lithography process In some embodiments, a pellicle-mask structure is provided. The pellicle-mask structure includes a mask substrate having a mask pattern formed over the mask substrate. The pellicle-mask structure further includes a pellicle frame disposed on the mask substrate. The pellicle-mask structure further includes a pellicle film disposed on the pellicle frame. In addition, the pellicle film is made of a carbon-based material.

In some embodiments, a method for forming a pellicle structure is provided. The method for forming a pellicle structure includes forming a metal layer over a substrate and forming a pellicle film made of a carbon-based material over the metal layer. The method for forming a pellicle structure further includes forming a polymer layer over the pellicle film and removing the metal layer and the substrate from the pellicle film. The method for forming a pellicle structure further includes attaching a pellicle frame to the pellicle film and removing the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle structure, comprising:
a single-layer pellicle film made of a carbon-based material, wherein the pellicle film is configured to protect a mask structure in a lithography process.

2. The pellicle structure as claimed in claim 1, wherein the carbon-based material is graphene.

3. The pellicle structure as claimed in claim 1, wherein the single-layer pellicle film is a single-layer graphene.

4. The pellicle structure as claimed in claim 1, wherein the single-layer pellicle film has a thickness in a range from about 0.01 µm to about 100 µm.

5. The pellicle structure as claimed in claim 1, further comprising:
a pellicle frame attached to the single-layer pellicle film.

6. The pellicle structure as claimed in claim 5, wherein the single-layer pellicle film has a peripheral region and a central region, and the pellicle frame is in direct contact with the peripheral region of the single-layer pellicle film.

7. The pellicle structure as claimed in claim 5, wherein the single-layer pellicle film has a peripheral region and a central region, and no supporting structure is disposed at the central region of the single-layer pellicle film.

8. A pellicle-mask structure, comprising:
a mask substrate having a mask pattern formed over the mask substrate;
a pellicle frame disposed on the mask substrate; and
a single-layer pellicle film disposed on the pellicle frame, wherein the single-layer pellicle film is made of a carbon-based material.

9. The pellicle-mask structure as claimed in claim 8, wherein the single-layer pellicle film is a single-layer graphene.

10. The pellicle-mask structure as claimed in claim 8, wherein the pellicle frame is configured to secure the single-layer pellicle film to the mask substrate.

11. The pellicle-mask structure as claimed in claim 8, wherein the single-layer pellicle film has a thickness in a range from about 0.01 µm to about 100 µm.

12. The pellicle-mask structure as claimed in claim 8, wherein the single-layer pellicle film has a length in a range from about 6 inches to about 10 inches.

13. A method for forming a pellicle structure, comprising:
forming a metal layer over a substrate;
forming a pellicle film made of a carbon-based material over the metal layer;
forming a polymer layer over the pellicle film;
removing the metal layer and the substrate from the pellicle film;
attaching a pellicle frame to the pellicle film; and
removing the polymer layer.

14. The method for forming a pellicle structure as claimed in claim 13, wherein the carbon-based material is graphene.

15. The method for forming a pellicle structure as claimed in claim 13, wherein the pellicle film is a single-layer graphene, a double-layer graphene, or a multiple-layer graphene.

16. The method for forming a pellicle structure as claimed in claim 13, wherein the metal layer is made of c copper (Cu), nickel (Ni), iron (Fe), zinc (Zn), tantalum (Ta), indium (In), manganese (Mn), chromium (Cr), titanium (Ti), platinum (Pt), magnesium (Mg), aluminum (Al), zirconium (Zr), iridium (Ir), tungsten (W), lanthanum (La), niobium (Nb), cobalt (Co), molybdenum (Mo), silver (Ag), gold (Au), or a related alloy.

17. The method for forming a pellicle structure as claimed in claim 13, wherein the polymer layer is made of polymethylmethacrylate (PMMA), polystyrene (PS), polyimide, epoxy, benzocyclobutene (BCB), or polybenzoxazole (PBO).

18. The method for forming a pellicle structure as claimed in claim 13, wherein the pellicle frame is attached to the pellicle film through electrostatic force.

19. The method for forming a pellicle structure as claimed in claim 18, wherein the step of attaching a pellicle frame to the pellicle film comprises:
exposing the pellicle frame to an X-ray, such that charges are induced at a top surface of the pellicle frame; and
attaching the top surface of the pellicle frame to the pellicle film.

20. The method for forming a pellicle structure as claimed in claim 13, wherein the pellicle frame is configured to secure the pellicle film to a mask structure.

21. The method for forming a pellicle structure as claimed in claim 13, wherein the pellicle film is a single-layer pellicle film.

* * * * *